United States Patent
Kim et al.

(10) Patent No.: US 6,791,410 B2
(45) Date of Patent: Sep. 14, 2004

(54) FEEDFORWARD AMPLIFIER AND METHOD OF IMPROVING THE PERFORMANCE THEREOF

(75) Inventors: Bumman Kim, Pohang (KR); Youngoo Yang, Kyungsangbuk-do (KR); Young Yun Woo, Pohang (KR)

(73) Assignee: Pohang University of Science and Technology Foundation, Pohang (KR)

( * ) Notice: Subject to any disclaimer, the term of this patent is extended or adjusted under 35 U.S.C. 154(b) by 0 days.

(21) Appl. No.: 10/440,123

(22) Filed: May 19, 2003

(65) Prior Publication Data

US 2004/0041629 A1 Mar. 4, 2004

(30) Foreign Application Priority Data

Aug. 29, 2002 (KR) .................... 10-2002-0051502

(51) Int. Cl.[7] .................................................. H03P 1/26
(52) U.S. Cl. ........................................ 330/151; 330/149
(58) Field of Search ........................ 330/52, 149, 151

(56) References Cited

U.S. PATENT DOCUMENTS 5,491,454 A * 2/1996 Matz .......................... 330/151
6,066,984 A * 5/2000 Tomaru et al. ............. 330/151

OTHER PUBLICATIONS

"2002 IEEE MTT–S International Microwave Symposium," Seattle, VA, Jun. 2002, pp. pp. 36 (presentation of A2).

Woo et al., "Feedforward Amplifier for WCDMA Base Stations with a New Adaptive Control Method," *2002 IEEE MTT–S CDROM, Sep. 2002, pp. 769–772.*

* cited by examiner

Primary Examiner—Khanh Van Nguyen
(74) Attorney, Agent, or Firm—Leydig, Voit & Mayer, Ltd.

(57) ABSTRACT

A feedforward amplifier, and a method of improving the performance thereof, are provided. More particularly, a feedforward amplifier using imperfect cancellation of a main signal and a method of improving the performance thereof, in which, by including a predetermined amount of a main signal in an error signal that is input to an error signal cancellation loop of the feedforward amplifier, more error components of a final output signal are removed, such that the linearity and efficiency of the final output signal improve.

5 Claims, 6 Drawing Sheets

FEEDFORWARD AMPLIFIER AND METHOD OF IMPROVING THE PERFORMANCE THEREOF

BACKGROUND OF THE INVENTION

1. Field of the Invention

The present invention relates to a feedforward amplifier, which is one of the leading devices of linearization systems for mobile communications base stations, and a method of improving the performance thereof, and more particularly, to a feedforward amplifier using imperfect cancellation of a main signal and a method of improving the performance thereof, in which by including a predetermined amount of a main signal in an error signal that is input to an error signal cancellation loop of the feedforward amplifier, more error components of a final output signal are removed such that the linearity and efficiency of the final output signal improve.

2. Description of the Related Art

In long distance telecommunications such as satellite communications and mobile communications, a signal cannot be delivered in one direct transmission. Hence, relay stations or base stations are located at predetermined intervals so that a signal can be amplified and transmitted again. A power amplifier used in the relay stations or base stations for this operates in a saturation region having a non-linear characteristic in order to obtain a maximum output. However, in this case, when multiple carriers (multi-carriers) are input to the power amplifier, these multiple carriers cause intermodulation distortion (IMD) such that the performance of the amplifier is greatly degraded. The intermodulation distortion component is generated by interactions between two carrier waves when two or more carriers are provided and pass a non-linear device.

It has been known that removal of these intermodulation distortion components with existing filters is very difficult and these components also work as a kind of noise greatly affecting the quality of calls. In order to reduce the non-linear characteristic of the power amplifier, a variety of methods have been suggested and used. One of the leading methods is a linearization method using feedforward. Feedforward is a method by which the characteristics of a system improve by providing a part of input to an output end to modify the output result, and linearization is to convert a device or a signal having a nonlinear characteristic to one having a linear characteristic.

Meanwhile, a linear amplifier is a kind of amplifier for providing power to a load. Linear amplifiers are classified as low frequency power amplifiers and high frequency power amplifiers. In a power amplifier, it is important to provide power efficiently with less distortion.

In ordinary feedforward linearization, only the intermodulation distortion component is extracted from a signal intermodulation-distorted with a carrier wave obtained from the output of a power amplifier, and the extracted intermodulation distortion component is again coupled, with the phase of the component inversed, to the output of the amplifier. By doing so, the intermodulation distortion signal is canceled and so that a carrier to intermodulation ratio, that is, the ratio of the power of the carrier to the power of the intermodulation distortion signal, improves.

FIG. 1 is a schematic diagram of the structure of an ordinary feedforward amplifier. Referring to FIG. 1, the feedforward amplifier basically includes two cancellation loops 10 and 20. The cancellation loop 10 is a main signal cancellation loop and the cancellation loop 20 is an error signal cancellation loop. Each loop 10 and 20 comprises a power amplifier 12 and 22, a powercoupler 14 and 24, a vector modulator 16 and 26, and a delay line 18 and 28.

The main signal cancellation loop 10 of FIG. 1 extracts only an error component of the main amplifier 12, using the difference of the input signal of the entire system and a non-linear signal amplified by the main amplifier 12. The error signal cancellation loop 20 amplifies the error component, which is provided from the main signal cancellation loop 10, through an error amplifier 22, inverts the phase of the error component, and couples the result with the output signal of the main amplifier 12 so that only the error component of the output signal of the main amplifier 12 is removed.

As described above, after being amplified by the main amplifier 12 through the two loops 10 and 20, the non-linear signal becomes linearized. It has been known that this feedforward amplifier 1 has good performance in linearity improvement, covers a wide band at the same time, and has good stability.

The prior art feedforward amplifier 1 as shown in FIG. 1 usually uses an error signal with a perfectly canceled main signal, which is schematically shown at the top of FIG. 3. As shown at the top of FIG. 3, a control method for generating an error signal with a perfectly canceled main signal is realized by the main signal cancellation loop 10 and the error signal cancellation loop 20 detecting and controlling different signals, respectively, as shown in FIG. 2. That is, in the adaptive control method of the prior art feedforward amplifier 1, the detection unit 1 detects an error signal, the control unit 1 controls the main signal cancellation loop 10, the detection unit 2 detects the error component of the final output signal, and the control unit 2 controls the error signal cancellation loop 20, as shown in FIG. 2. Here, the main signal cancellation loop 10 is adaptively controlled so that the component of the main signal in the detected error signal is minimized. In this way, the main signal in the error signal is perfectly canceled.

However, since most systems use a modulated signal as an input signal, an error signal with an imperfectly canceled main signal, instead of an error signal with a perfectly canceled main signal, can show optimal performance.

SUMMARY OF THE INVENTION

To solve the above problems, it is an object of the present invention to provide a feedforward amplifier and a method of improving the performance thereof, in which a predetermined amount of a main signal is made to be included in an error signal input to the error signal cancellation loop of a feedforward amplifier, considering that in the feedforward amplifier, an error signal with an imperfectly canceled main signal, instead of an error signal with a perfectly canceled main signal, can show optimal performance.

That is, it is an object of the present invention to provide a feedforward amplifier using imperfect cancellation of a main signal and a method of improving the performance thereof, in which by including a predetermined amount of a main signal in an error signal that is input to an error signal cancellation loop of the feedforward amplifier, more error components of a final output signal are removed such that the linearity and efficiency of the final output signal improve.

According to an aspect of the present invention, there is provided a feedforward amplifier comprising a main signal cancellation loop which comprises a main amplifier and a vector modulator and extracts an error component of the main amplifier; an error signal cancellation loop which comprises an error amplifier and a vector modulator and removes the error component in the output signal of the main amplifier; a final error signal detection unit which detects an error component of a final output signal of the feedforward amplifier; a main signal cancellation loop control unit which controls the main signal cancellation loop based on the error component detected by the final error signal detection unit; and an error signal cancellation loop control unit which controls the error signal cancellation loop based on the error component detected by the final error signal detection unit, wherein the error signal generated by the main signal cancellation loop is optimized in the direction linearizing the final output signal and the main signal cancellation loop is adaptively controlled by the main signal cancellation loop control unit.

It is preferable that the error signal output from the main signal cancellation loop has an imperfectly canceled main signal.

It is preferable that the output signal of the main signal cancellation loop control unit is input to the vector modulator of the main signal cancellation loop, and the output signal of the error signal cancellation loop control unit is input to the vector modulator of the error signal cancellation loop.

According to another aspect of the present invention, there is provided a method for improving the performance of a feedforward amplifier comprising a main signal cancellation loop and an error signal cancellation loop, the method comprising detecting the error component of a final output signal of the feedforward amplifier; and controlling the main signal cancellation loop and the error signal cancellation loop at the same time using the detected error component.

It is preferable that the method further comprises, before controlling the loops, detecting the error signal of the main signal cancellation loop and using the error signal, controlling the main signal cancellation loop; and detecting the error component of a final output signal of the feedforward amplifier and controlling the error signal cancellation loop.

BRIEF DESCRIPTION OF THE DRAWINGS

The above objects and advantages of the present invention will become more apparent by describing in detail preferred embodiments thereof with reference to the attached drawings in which:

FIG. 6a is a graph of an error signal spectrum and FIG. 6b is a graph of a final output signal spectrum.

DESCRIPTION OF THE PREFERRED EMBODIMENTS

Figure 1:
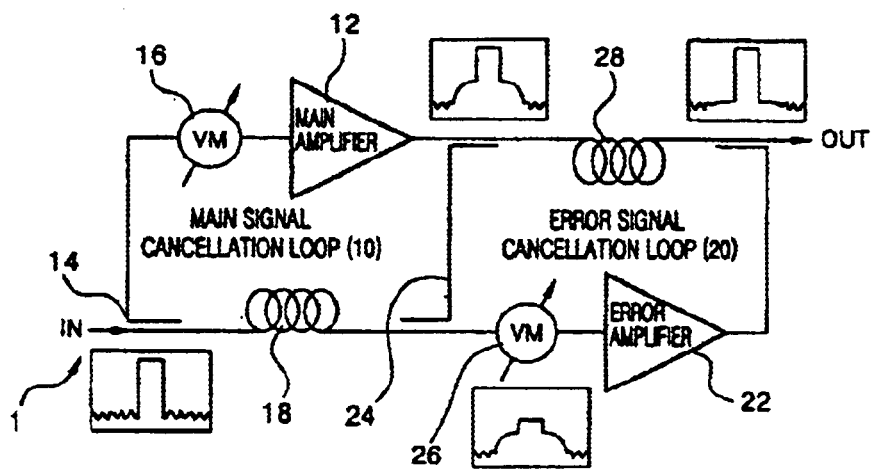
FIGS. 1 and 2 are schematic diagrams of the structures of feedforward amplifiers according to the prior art.
Figure 2:
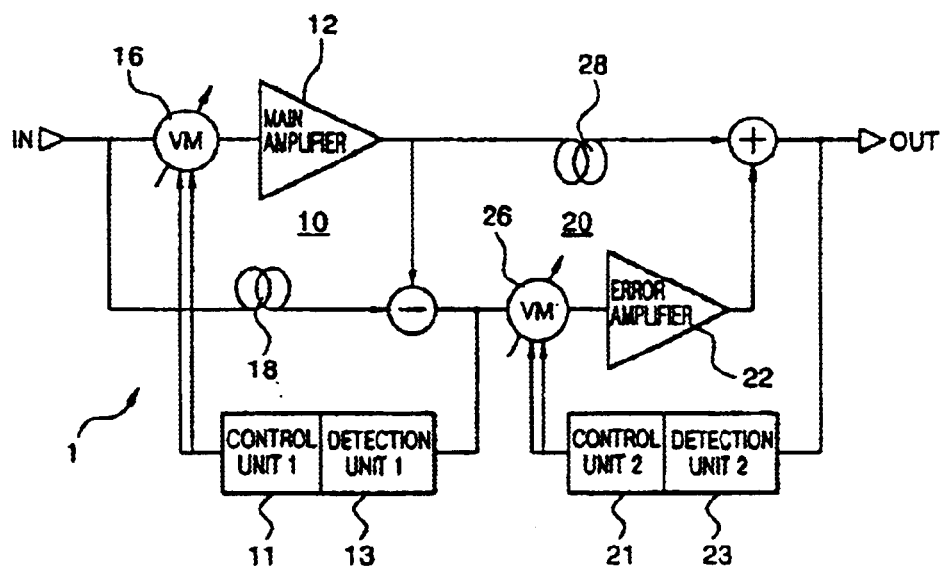
Figure 3:
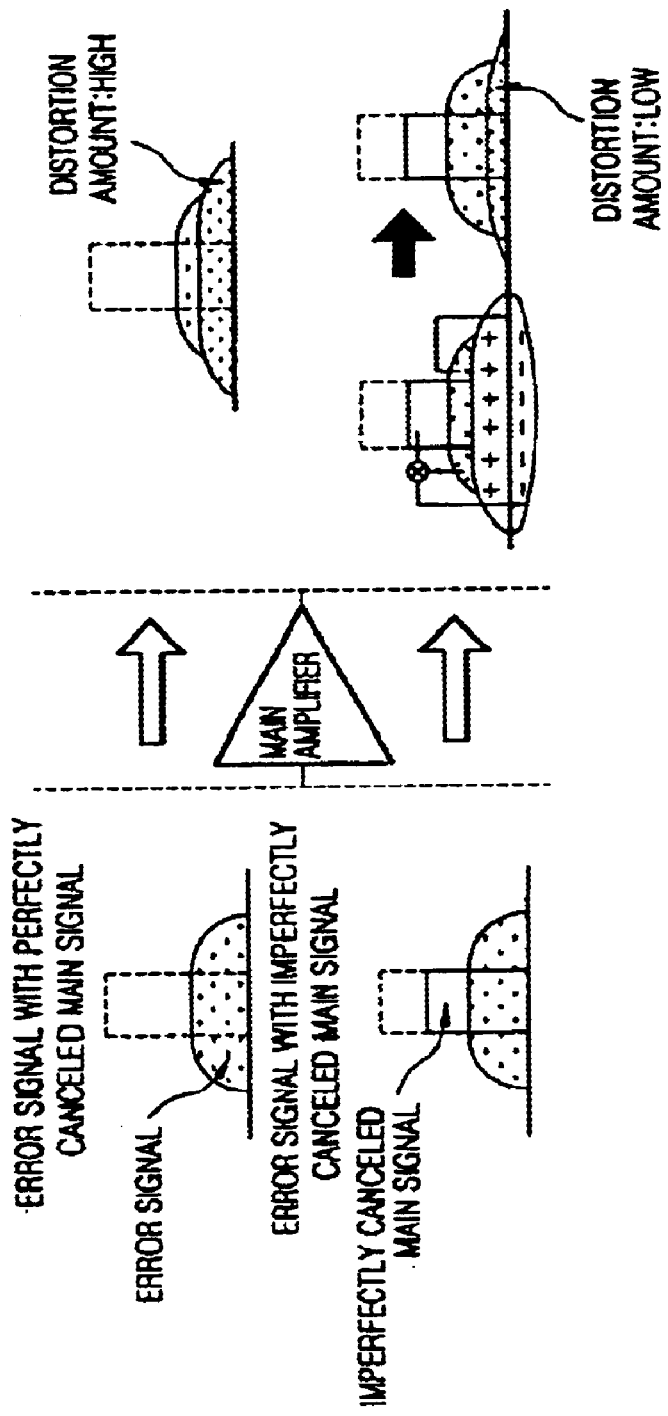
FIG. 3 is a conceptual diagram of a method of improving the performance of a feedforward amplifier according to the present invention.
Figure 4:
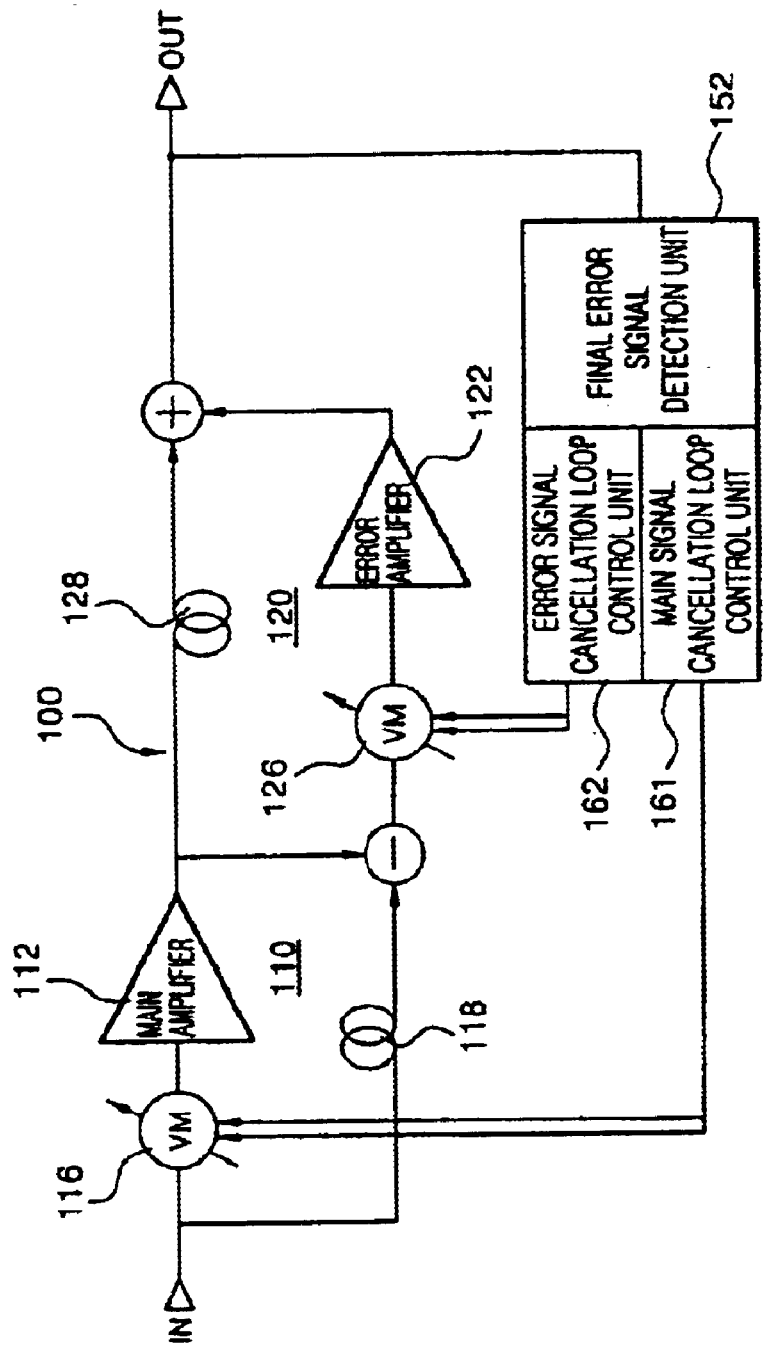
FIG. 4 is a diagram of the structure of a feedforward amplifier according to the present invention.
Figure 5:
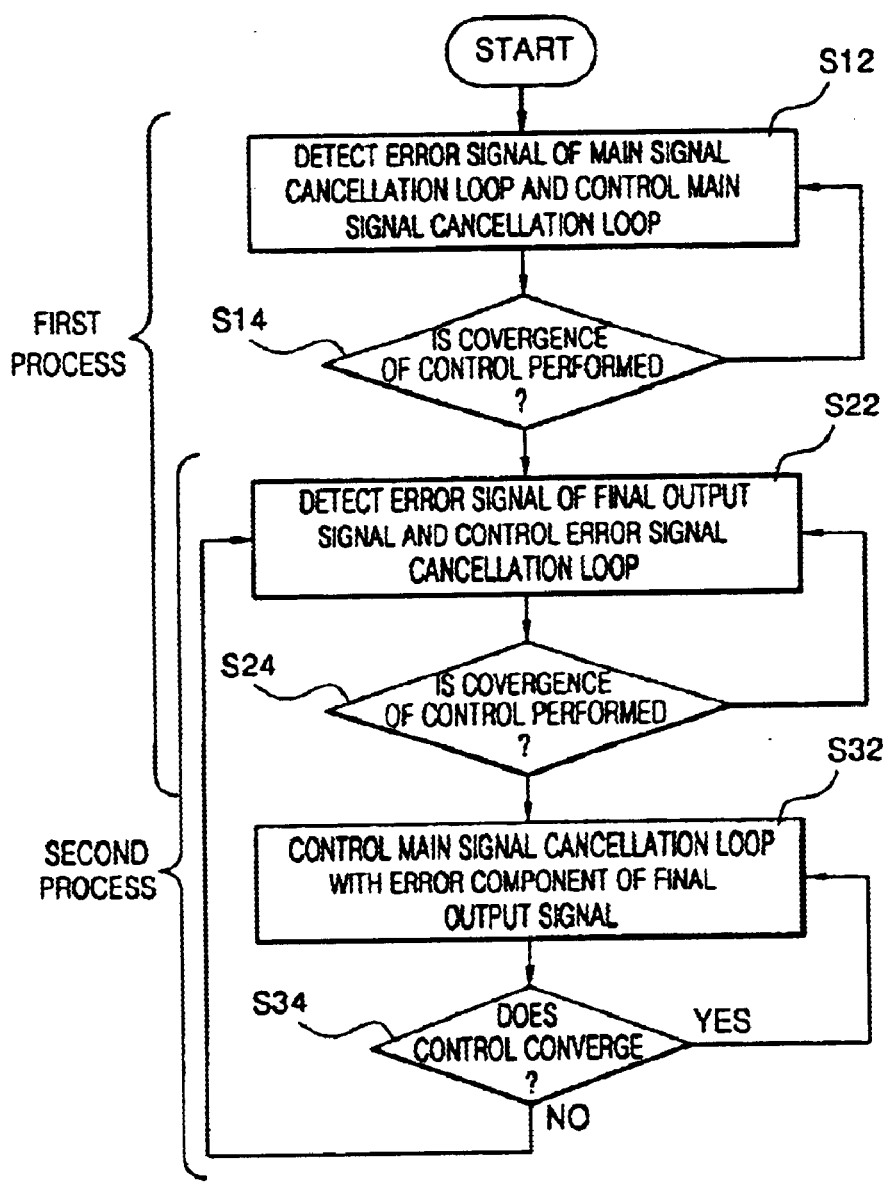
FIG. 5 is a flowchart of the steps performed in the method of improving performance of a feedforward amplifier according to the present invention.
Figure 6A:
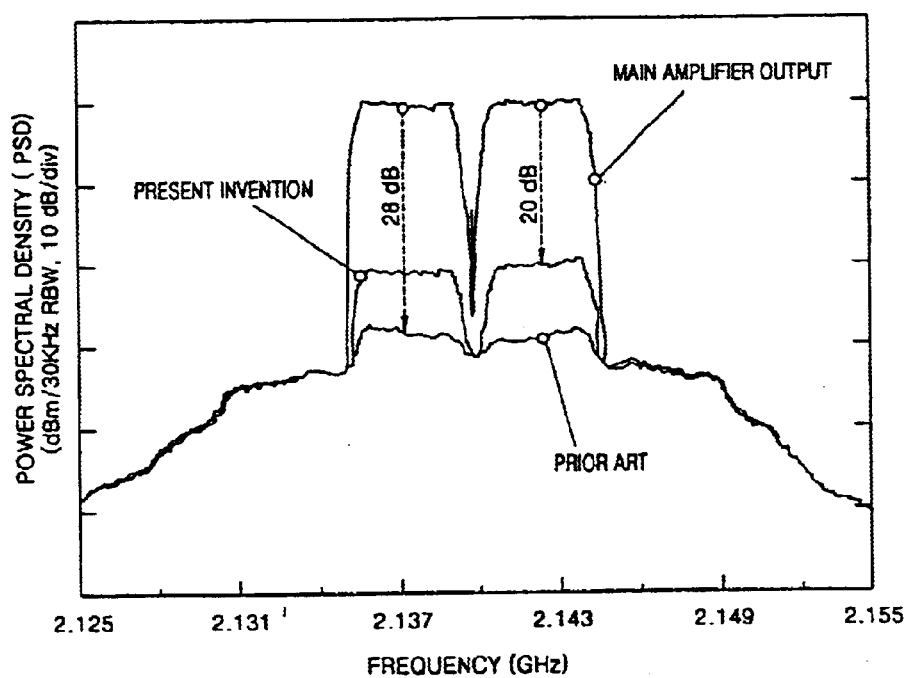
FIGS. 6a and 6b are spectrum graphs comparing the feedforward amplifier according to the present invention with the prior art feedforward amplifier, and more specifically.
Figure 6B:
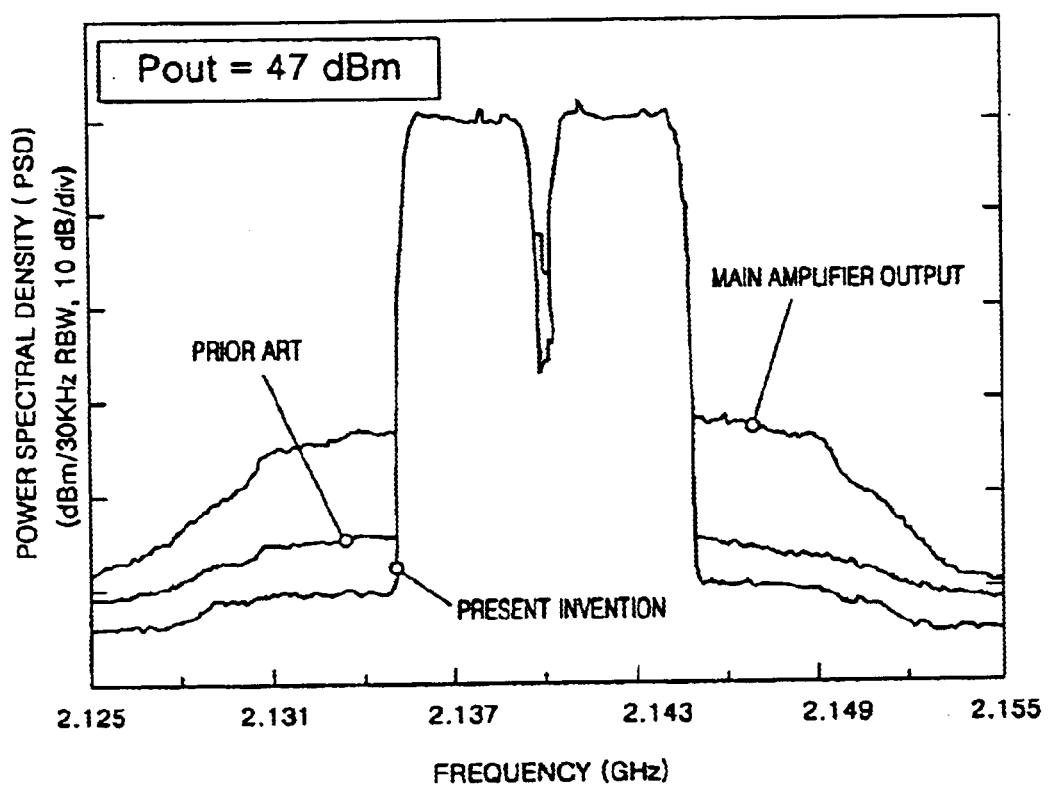

FIG. 3 is a conceptual diagram of a method for improving the performance of a feedforward amplifier according to the present invention, and FIG. 4 is a diagram of the structure of a feedforward amplifier according to the present invention. FIG. 5 is a flowchart of the steps performed in the method of improving the performance of a feedforward amplifier according to the present invention, and FIGS. 6a and 6b are spectrum graphs comparing the feedforward amplifier according to the present invention with the prior art feedforward amplifier.

Referring to FIG. 4, the feedforward amplifier 100 according to the present invention comprises a main signal cancellation loop 110 which comprises a main amplifier 112 and a vector modulator 116 and extracts an error component of the main amplifier 112; an error signal cancellation loop 120 which comprises an error amplifier 122 and a vector modulator 126 and removes an error component in the output signal of the main amplifier 112; a final error signal detection unit 152 which detects the error component of a final output signal of the feedforward amplifier 100; a main signal cancellation loop control unit 161 which controls the main signal cancellation loop 110 based on the error component detected by the final error signal detection unit 152; and an error signal cancellation loop control unit 162 which controls the error signal cancellation loop 120 based on the error component detected by the final error signal detection unit 152. Here, the main signal cancellation loop 110 is adaptively controlled by the main signal cancellation loop control unit 161 so that the error signal generated by the main signal cancellation loop 110 can be optimized in the direction linearizing the final output signal. Also, in the feedforward amplifier 100 of the present invention, the error signal output from the main signal cancellation loop 110 has an imperfectly canceled main signal, as shown at the bottom of FIG. 3.

Meanwhile, in the feedforward amplifier of the present invention, the output signal of the main signal cancellation loop control unit 161 is input to the vector modulator 116 of the main signal cancellation loop 110 and the output signal of the error signal cancellation loop control unit 162 is input to the vector modulator 126 of the error signal cancellation loop 120.

Reference numbers 118 and 128 of FIG. 4 indicate delay compensation lines that perform the same functions as the prior art delay compensation lines 18 and 28.

Referring to FIG. 5, the method of improving the performance of a feedforward amplifier according to the present invention comprises step S200 in which the error component of the final output signal of the feedforward amplifier 100 is detected and, using the detected error component, the main signal cancellation loop 110 and the error signal cancellation loop 120 are controlled at the same time. Here, the simultaneous control step S200 comprises step S22 for detecting the error component of the final output signal and controlling the error signal cancellation loop 120, step S24 for determining whether or not convergence of the step S22 is accomplished, step S32 for controlling the main signal cancellation loop using the error component of the final output signal, and step S34 for determining whether or not convergence of the step S32 is accomplished.

Meanwhile, the method of improving the performance of a feedforward amplifier of the present invention comprises a preceding step S100 which is performed preceding the simultaneous control step S200 that is the major characteristic of the method of the present invention. The preceding step S100 comprises step S12 for detecting the error signal of the main signal cancellation loop 110 and controlling the main signal cancellation loop 110, step S14 for determining whether or not the convergence of step S12 is accomplished, step S22 for detecting the error component of the final output signal and controlling the error signal cancellation loop 120, and step S24 for determining whether or not convergence of the step S22 is accomplished.

Referring to FIG. 5, it is shown that because of the characteristic of the method of improving the performance of a feedforward amplifier of the present invention, steps S22 and S24 are included both in the preceding step S100 and the simultaneous control step S200.

The operation of the thus constructed feedforward amplifier and the method of improving the performance thereof according to the present invention will now be explained referring to FIGS. 2 through 6b.

FIG. 3 briefly shows the effect of imperfect cancellation of a main signal in the error signal of the feedforward amplifier according to the present invention. In the prior art feedforward amplifier, an error signal with a perfectly cancelled main signal is used. In this case, as shown at the top of FIG. 3, due to the non-linearity of the error amplifier 22, distortion components of the error amplifier 22 itself occur greatly. This causes degradation in linearity of the feedforward amplifier, and the less the capacity of the error amplifier 22, the greater this degradation becomes.

Shown at the bottom of FIG. 3 is a conceptual diagram of a method used in the present invention. This shows the output of the error amplifier 122 when the main signal is imperfectly canceled. This imperfect cancellation signal comprises the remaining main signal and the pure error signal, and these two signals cause a signal intermodulated by the error amplifier 122. The generated intermodulation signal can be made to have a phase opposite to the phase of the distortion component of the error amplifier 122 itself through phase change by the vector modulator 116 of the main signal cancellation loop 110 shown in FIG. 4. If an intermodulation signal having the same size as, but a phase opposite to, the intermodulation signal is generated by appropriate control, the distortion of the error amplifier 122 itself can be perfectly removed. This has the same effect as increasing the capacity of the error amplifier 122. Accordingly, the final output signal does not contain the distortion component of the error amplifier 122 itself such that the linearity improves more than in the prior art method.

Referring to FIG. 4, the error signal of the final output signal of the feedforward amplifier 100 is detected by the final error signal detection unit 152. If the error component of the final output signal is detected by the final error signal detection unit 152, the main signal cancellation loop control unit 161 and the error signal cancellation loop control unit 162 control, at the same time, the main signal cancellation loop 110 and the error signal cancellation loop 120, respectively. In this case, since the main signal cancellation loop 110 is adaptively controlled so that the error component of the final output signal is minimized, the error signal generated by the main signal cancellation loop 100 is optimized in the direction linearizing the final output signal. That is, the error signal is not a signal with a perfectly canceled main signal, but an optimum imperfect cancellation signal. This imperfect cancellation signal generates a signal intermodulated with the two signals by the error amplifier 122, as described above, and works as an important factor for improving linearity. Because of this factor, the entire feedforward performance improves greatly over the prior art.

Referring to FIG. 5, the method of improving the performance of a feedforward amplifier according to the present invention comprises two processes S100 and S200. In the preceding step S100, an error signal is detected and the main signal cancellation loop 110 is controlled in steps S12 and S14, and the error component of the final output signal is detected and the error signal cancellation loop 120 is controlled in steps S22 and S24, as in the prior art method.

The preceding step S100 is needed in order to obtain initial values of the two vector modulators 116 and 126. Through this preceding step S100, the convergence speed of the simultaneous control step S200, which will now be explained, increases, and a danger of falling into a local minimum point decreases. If the convergence of the preceding step S100 is accomplished, the simultaneous control step S200 is performed. In the simultaneous control step S200, the error component of the final output signal is detected, and control of the main signal cancellation loop 100 and control of the error signal cancellation loop 120 are performed at the same time in steps S32 and S34. When there is no external interrupt, the adaptive control according to the present invention stays in the simultaneous control step S200 and the gain of imperfect cancellation is obtained such that optimum performance of the feedforward 100 is obtained.

In order to inspect the performance of the feedforward amplifier according to the present invention, a 50 W-level adaptive control feedforward amplifier for WCDMA base stations which operate at a 2.14 GHz band was designed and manufactured, and the characteristics were measured as shown in FIG. 6. Here, a down link WCDMA 2-carrier signal was used as the input signal.

FIGS. 6a and 6b are spectrum graphs comparing the results of measuring the error signal, that is, the output signal of the main amplifier, of the prior art adaptive control method, and the error signal of the adaptive control method of the present invention, when an average output power is 50 W. FIG. 6a is a graph of the error signal spectrum and FIG. 6b is the graph of the final output signal spectrum.

Referring to FIGS. 6a and 6b, the main signal component in the error signal in the prior art method is almost removed, but removal of the main signal component in the method of the present invention is by about 8 dB less than the prior art method. The remaining main signal that is not removed works for linearity improvement as described above. When the down link WCDMA 2-carrier signal was input and the output power was about 50 W, an adjacent channel leakage ratio (ACLR) with about 7 dB improvement was confirmed at a 5 MHz offset location.

As described above, in the feedforward amplifier and the method of improving the performance thereof according to the present invention, by including a predetermined amount of a main signal in an error signal that is input to an error signal cancellation loop of the feedforward amplifier, more error components of a final output signal are removed such that the linearity and efficiency of the final output signal improve.

Also, according to the present invention, only by changing an adaptive control method, without additional expense, the linearity of a feedforward amplifier and price competitiveness can be improved greatly.

An optimum embodiment of the present invention has been described in above and are shown in the attached drawings. However, the present invention is not limited to the preferred embodiment described above, and it is apparent that variations and modifications by those skilled in the art can be effected within the spirit and scope of the present invention defined in the appended claims. Therefore, the scope of the present invention is not determined by the above description but by the accompanying claims.

What is claimed is:

1. A feedforward amplifier comprising:

a main signal cancellation loop which comprises a main amplifier and a first vector modulator and which extracts an error component of an output signal of the main amplifier;

an error signal cancellation loop which comprises an error amplifier and a second vector modulator and which removes the error component in the output signal of the main amplifier;

a final error signal detection unit which detects an error component of a final output signal of the feedforward amplifier;

main signal cancellation loop control unit which controls the main signal cancellation loop based on the error component detected by the final error signal detection unit; and an error signal cancellation loop control unit which controls the error signal cancellation loop based on the error component detected by the final error signal detection unit, wherein the error signal extracted by the main signal cancellation loop is optimized for linearizing the final output signal and the main signal cancellation loop is adaptively controlled by the main signal cancellation loop control unit.

2. The feedforward amplifier of claim 1, wherein the error signal extracted from the main signal cancellation loop is a signal with an imperfectly canceled main signal.

3. The feedforward amplifier of claim 1, wherein an output signal of the main signal cancellation loop control unit is input to the first vector modulator, and an output signal of the error signal cancellation loop control unit is input to the second vector modulator.

4. A method of improving performance of a feedforward amplifier comprising a main signal cancellation loop and an error signal cancellation loop, the method comprising:

detecting an error component of a final output signal of the feedforward amplifier; and controlling the main signal cancellation loop and the error signal cancellation loop at the same time using the error component detected.

5. The method of claim 4, further comprising, before controlling the main signal cancellation loop and the error signal cancellation loop:

detecting an error signal of the main signal cancellation loop and, using the error signal, controlling the main signal cancellation loop; and detecting the error component of a final output signal of the feedforward amplifier and controlling the error signal cancellation loop.

* * * * *